United States Patent
Masoumi et al.

(10) Patent No.: US 9,933,807 B2
(45) Date of Patent: Apr. 3, 2018

(54) IN-RUSH CURRENT CONTROLLER FOR A SEMICONDUCTOR SWITCH

(71) Applicant: Dialog Semiconductor (UK) Limited, London (GB)

(72) Inventors: Mohammad Masoumi, Aichelberg (DE); Frank Kronmueller, Neudenau (DE); Robert Prinz, Stuttgart (DE)

(73) Assignee: Dialog Semiconductor (UK) Limited, Reading (GB)

( * ) Notice: Subject to any disclaimer, the term of this patent is extended or adjusted under 35 U.S.C. 154(b) by 148 days.

(21) Appl. No.: 14/833,349

(22) Filed: Aug. 24, 2015

(65) Prior Publication Data
US 2016/0252924 A1    Sep. 1, 2016

(30) Foreign Application Priority Data
Feb. 27, 2015   (DE) .......................... 10 2015 002 501

(51) Int. Cl.
G05F 3/26 (2006.01)
H03K 17/16 (2006.01)

(52) U.S. Cl.
CPC ............ G05F 3/262 (2013.01); H03K 17/165 (2013.01)

(58) Field of Classification Search
CPC . G05F 3/22; G05F 3/222; G05F 3/227; G05F 3/24; G05F 3/242; G05F 3/247; G05F 3/26; G05F 3/262; G05F 3/265; G05F 3/267; G05F 3/30; H02M 2001/0003; H02M 2001/0029
USPC ......................................... 323/304, 311–317
See application file for complete search history.

(56) References Cited

U.S. PATENT DOCUMENTS

| | | | | |
|---|---|---|---|---|
| 4,989,003 A | * | 1/1991 | Sauer | ...................... H03K 5/249 327/77 |
| 6,100,742 A | * | 8/2000 | Erckert | ................ H03K 17/166 327/374 |
| 8,154,263 B1 | * | 4/2012 | Shi | .......................... G05F 1/575 323/269 |

(Continued)

FOREIGN PATENT DOCUMENTS

| | | |
|---|---|---|
| EP | 0854574 | 7/1998 |
| EP | 2426820 | 3/2012 |

OTHER PUBLICATIONS

German Office Action and English Translation 10 2015 002 501.5, dated Oct. 23, 2015, Dialog Semiconductor (UK) Limited.

*Primary Examiner* — Jeffrey Gblende
*Assistant Examiner* — David A. Singh
(74) *Attorney, Agent, or Firm* — Saile Ackerman LLC; Stephen B. Ackerman

(57) ABSTRACT

An in-rush current controller to turn-on a semiconductor output switch is described. The output switch is arranged in series with an output capacitor. The switch comprises a switch control port for controlling an output current and an output voltage. The controller comprises an amplifier to source or sink a switch control current to or from the switch control port, wherein the switch control current is dependent on an amplifier control current at an amplifier control port. The controller comprises a reference current source to provide a reference current at the amplifier control port, subject to a control signal indicating that the output switch is to be turned on. Furthermore, the controller comprises a feedback capacitor to provide a feedback current at the amplifier control port in dependence of a variation of the output voltage.

26 Claims, 12 Drawing Sheets

(56) References Cited

U.S. PATENT DOCUMENTS

| | | | |
|---|---|---|---|
| 2003/0174009 A1* | 9/2003 | Kimura | H03K 19/00384 327/427 |
| 2006/0012411 A1* | 1/2006 | De Langen | H03F 1/02 327/170 |
| 2010/0066453 A1* | 3/2010 | Busking | H03F 1/301 330/296 |
| 2011/0175650 A1* | 7/2011 | Tumminaro | H03K 17/163 327/109 |

* cited by examiner

600 ⎯⎯↘

601
Sourcing a switch control current to the switch control port from a control supply voltage or sinking a switch control current from the switch control port towards ground

↓

602
Providing a reference current at the amplifier control port subject to a control signal indicating that the output switch is to be turned on

↓

603
Providing a feedback current at the amplifier control port in dependence of a variation of the output voltage e.g. using a feedback capacitor arranged to couple the output node to the amplifier control port

*FIG. 6*

IN-RUSH CURRENT CONTROLLER FOR A SEMICONDUCTOR SWITCH

TECHNICAL FIELD

The present document relates to the control of transistors. In particular, the present document relates to controlling the slew rate and the in-rush current of a semiconductor switch.

BACKGROUND

Semiconductor switches (notably transistors) may be used to control the load current which is provided to a load (e.g. as part of a power converter or a battery charger). In this context, it may be important to control the slew rate of the voltage at the switch during a turn-on period of the switch and/or to control the in-rush current through the switch during the turn-on period of the switch.

SUMMARY

The present document addresses the technical problem of providing a highly accurate control of the slew rate and/or of the in-rush current of a semiconductor switch during a turn-on period of the switch. The controlled switch is referred to herein as an output switch. According to an aspect, an in-rush current controller configured to turn-on a semiconductor output switch (notably a metaloxide semiconductor, MOS, transistor) is described. The output switch is arranged in series with an output capacitor between an output supply voltage and ground. The output switch comprises a switch control port (e.g. a gate) for controlling an output current through the switch and for controlling an output voltage at an output node between the output switch and the output capacitor. The output current may also be referred to as a drain-source current or as an in-rush current of the output switch. The output node may correspond to a source of the output switch.

The in-rush current controller comprises an amplifier which is configured to source a switch control current to the switch control port from a control supply voltage or to sink a switch control current from the switch control port towards ground. The switch control current may be used to charge or to discharge a gate capacitance of the output switch for turning on the output switch. In particular, a switch control current sourced from the control supply voltage may be used to charge the gate capacitance of an NMOS output switch, thereby turning on the NMOS output switch. On the other hand, a switch control current sunk to ground may be used to discharge the gate capacitance of a PMOS output switch, thereby turning off the PMOS output switch.

The switch control current is dependent on an amplifier control current at an amplifier control port at the input of the amplifier. In particular, the amplifier may be configured to amplify an amplifier control current at the amplifier control port to provide the switch control current at the switch control port. The switch control port may be (directly) coupled to the output of the amplifier.

The in-rush current controller further comprises a reference current source which is configured to provide a reference current at the amplifier control port. The reference current may be provided selectively for turning on the output switch. In particular, the reference current may be provided, subject to a control signal indicating that the output switch is to be turned on. The reference current contributes to the current at the input of the amplifier and is amplified by the amplifier into a switch control current for charging/discharging the gate of the output switch, thereby turning on the output switch. For this purpose, the reference current may be a current towards ground.

The in-rush current controller may comprise a control switch which is configured to couple the amplifier control port to a high potential (e.g. to the control supply voltage) for turning off the output switch. Furthermore, the control switch may be configured to decouple the amplifier control port from the high potential for turning on the output switch, such that a current at the amplifier control port depends on the reference current. The control signal may be applied to a gate of the control switch.

The in-rush current controller further comprises a feedback capacitor which is arranged to couple the output node to the amplifier control port and which is configured to provide a feedback current at the amplifier control port in dependence of a variation of the output voltage. Typically, the feedback current subtracts from the reference current, notably if the output voltage at the output node increases. As such, the net current at the input of the amplifier, i.e. at the amplifier control port, is reduced as soon as the output switch is turned on, thereby controlling the in-rush current through the output switch and the slew rate of the output voltage. The amplifier provides a buffer function thereby enabling an efficient slew rate/in-rush current control for differently sized output switches.

The in-rush current controller may further comprise an auxiliary feedback capacitor which is arranged to couple the switch control port to the amplifier control port and which is configured to provide an auxiliary feedback current at the amplifier control port in dependence of a variation of a switch control voltage at the switch control port. The auxiliary feedback current typically subtracts from the reference current, notably in case of an increase of the switch control voltage. By making use of an auxiliary feedback capacitor, the stability of the in-rush current/slew rate control may be increased.

The amplifier may comprise an amplifier transistor and a bias transistor, which are arranged in series between the control supply voltage and ground. The switch control port may be coupled to a midpoint between the amplifier transistor and the bias transistor. The amplifier transistor and the bias transistor may comprise MOS transistors, respectively. In particular, the amplifier transistor may comprise a PMOS transistor and/or the bias transistor may comprise an NMOS transistor.

The bias transistor may be used to set a bias current towards ground at the midpoint between the amplifier transistor and the bias transistor, thereby maintaining the gate of the output switch (notably in case of an NMOS output switch) discharged and thereby maintaining the output switch in off-state. A current through the amplifier transistor may be controlled via a transistor control port (e.g. a gate) of the amplifier transistor, and a current at the transistor control port may be dependent on the reference current and the feedback current. By way of example, the transistor control port may correspond to (or may be) the amplifier control port. As such, the amplifier transistor may be turned on in dependence of the reference current and the feedback current, thereby sourcing a current from the control supply voltage, which charges the gate of the output switch at the midpoint between the amplifier transistor and the bias transistor.

The amplifier may comprise a differential amplifier which is configured to determine a differential voltage in dependence of the reference current and the feedback current. An input port of the differential amplifier may correspond to the amplifier control port. The amplifier transistor may be controlled in dependence of the differential voltage at the output of the differential amplifier. The use of a differential amplifier may be beneficial for making the in-rush controller more robust with respect to noise of the control supply voltage.

The amplifier may further comprise a master transistor and a slave transistor, which are arranged in series between the control supply voltage and ground. The master transistor and the slave transistor may be used to convert the differential voltage at the output of the differential amplifier into a current for controlling the amplifier transistor. In particular, a current through the master transistor may be controlled using the differential voltage. Furthermore, the slave transistor may form a current mirror with the amplifier transistor.

The in-rush current controller may further comprise sensing means which are configured to provide an indication of the switch control current at the switch control port. The sensing means may comprise a sensing transistor and a sensing bias transistor, which are arranged in series between the control supply voltage and ground. A control port of the sensing transistor may be coupled to a control port of the amplifier transistor and a control port of the sensing bias transistor may be coupled to a control port of the bias transistor. The sensing transistor may be of the same type of transistor as the amplifier transistor (e.g. a PMOS transistor) and/or the sensing bias transistor may be of the same type of transistor as the bias transistor (e.g. an NMOS transistor). The indication of the switch control current may be dependent on a current at a midpoint between the sensing transistor and the sensing bias transistor.

Furthermore, the in-rush current controller may comprise current boosting means which are configured to provide an auxiliary current at the amplifier control port. if the indication of the switch control current indicates that the switch control current is below a pre-determined current threshold, if it is determined (based on the indication of the switch control current) that the output switch is still in a first phase of the turn-on period (and not yet fully opened). The current boosting means may comprise a current mirror and/or a current comparator (e.g. a "winner takes all" circuit). The auxiliary current may be provided such that the auxiliary current adds to the reference current. As a result of this, the first phase of the turn-on period may be accelerated, thereby allowing a second phase of the turn-on period (when the in-rush current flows through the output switch) to be lengthened, i.e. thereby allowing a maximum in-rush current to be reduced.

The in-rush current controller may further comprise an auxiliary reference current source which is configured to provide an auxiliary reference current (e.g. only) if a switch control voltage at the switch control port of the output switch exceeds a pre-determined voltage threshold, i.e. (e.g. only) if the switch control voltage indicates that the second phase of the turn-on period of the output switch (during which the output capacitor is charged) is terminated and a third phase of the turn-on period (during which the gate of the output switch is fully charged/discharged to fully turn-on the output switch) has started. The auxiliary reference current may add to the reference current, thereby speeding up the third phase of the turn-on period. As a result of this, the second phase of the turn-on period may be lengthened to allow the maximum in-rush current to be reduced.

According to another aspect, a method for controlling an in-rush current through a semiconductor output switch during a turn-on period of the output switch is described. The output switch is arranged in series with an output capacitor e.g. between an output supply voltage and ground. The output switch comprises a switch control port for controlling an output current through the switch and for controlling an output voltage at an output node between the output switch and the output capacitor.

The method comprises sourcing a switch control current to the switch control port e.g. from a control supply voltage or sinking a switch control current from the switch control port e.g. towards ground using an amplifier, for turning on the output switch. The switch control current is dependent on an amplifier control current at an amplifier control port of the amplifier. Furthermore, the method comprises providing a reference current at the amplifier control port, subject to a control signal indicating that the output switch is to be turned on. In addition, the method comprises providing a feedback current at the amplifier control port in dependence of a variation of the output voltage, e.g. using a feedback capacitor arranged to couple the output node to the amplifier control port.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIG. 6 shows a flow chart of an example method for controlling an output switch during a turn-on period.

DESCRIPTION

As indicated above, the present document is directed at controlling the slew rate and/or the in-rush current of a semiconductor output switch in an accurate manner. In particular, the matching of a load current which is provided to the load that is coupled to the semiconductor output switch may be achieved by an accurate slew rate control of the semiconductor output switch.

Figure 1A:
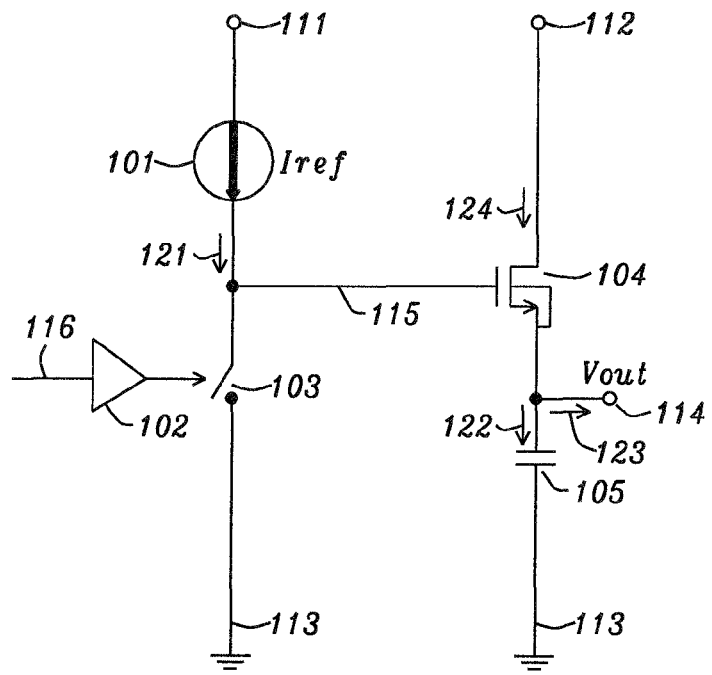
FIG. 1a shows an example controller for an output switch.

FIG. 1 shows example control circuitry for controlling an output switch 104 which is arranged between an output supply voltage 112 and ground 113. The output switch 104 is used to provide a load current 123 at an output voltage $V_{out}$ 114 to a load. Typically the output switch 104 is coupled to ground 113 via an output capacitor 105 (which may be arranged in parallel to the load). In the illustrated example, the output switch 104 comprises a metaloxide semiconductor (MOS) switch, notably an n-type MOS or NMOS switch.

The output switch 104 is controlled using a reference current $I_{ref}$ 121 which is generated using a reference current source 101. The reference current 121 is used to charge a gate of the output switch 104, thereby increasing the switch control voltage 115 (e.g. the gate voltage) above the threshold voltage of the output switch 104 and thereby turning on the output switch 104. The turn-on period for turning on the output switch 104 may be initiated using a control switch 103 which is driven by a control driver 102 and a control signal 116. The control switch 103 may be closed to couple the switch control port (e.g. the gate) of the output switch 104 to ground 113, thereby closing the output switch 104. When opening the control switch 103, the reference current 121 flows into the gate capacitor of the output switch 104, thereby opening the output switch 104, i.e. thereby turning on the output switch 104.

Since the output switch 104 feeds the output capacitor 105, the corresponding current $I_C$ 122 into the output capacitor 105 is given by $$I_C = C_{out} \cdot \frac{dV_{out}}{dt},$$

where $C_{out}$ denotes the capacitance of the output capacitor 105, and $dV_{out}$ the variation of the output voltage 114. In the illustrated example, the NMOS switch 104 charges the output capacitance 105 to the output supply voltage 112, subject to the current reference 121. The NMOS 104 switch is deactivated, if the control signal 116 is low. In active mode, the control switch 103 is off and the gate of the NMOS switch 104 is charged by the reference current source 101.

Figure 1B:
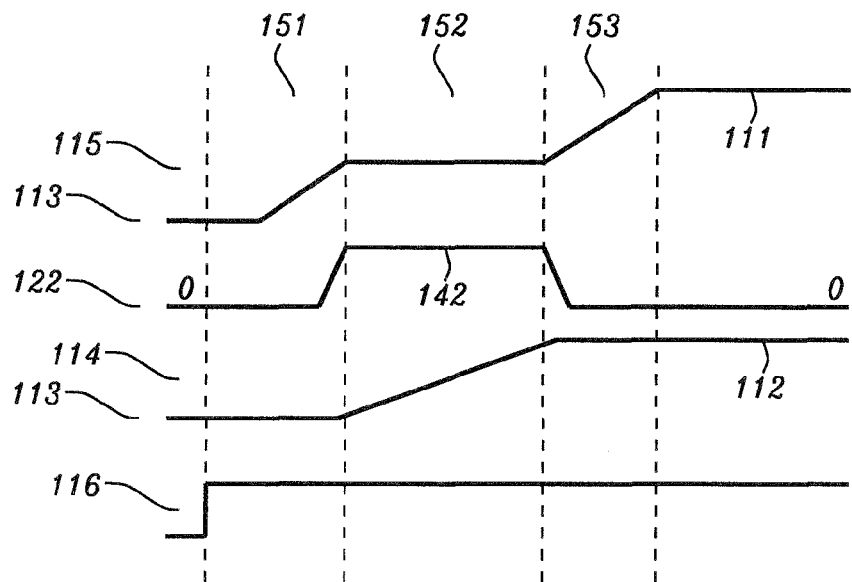
FIG. 1b shows example signals during the turn-on period of an output switch.

The charging time of the output capacitance 105 and the turn-on period of the output switch 104 may be divided into three phases 151, 152, 153, as illustrated in FIG. 1b. In a first phase 151 (subject to putting high the control signal 116), the output switch 104 is not on, the capacitor current 124 is small and the capacitor 105 is only charged slowly. In a second phase 152, the capacitor current 122 increases rapidly, as the gate-source voltage (i.e. the switch control voltage) 115 at the output switch 104 is sufficiently high such that the output switch 104 is on. The capacitor current 124 starts to reduce in a third phase 153, when the output switch 104 comes to the triode region, and falls to zero after full charge of the output capacitor 104. The capacitor current 122 typically corresponds to the in-rush current 124 through the output switch 104, in case there is no load current 123.

The maximum 142 of the capacitor current 122/the in-rush current 124 depends on the maximum slew rate $$\frac{dV_{out}}{dt}$$

of the output voltage 114, wherein the slew rate $$\frac{dV_{out}}{dt}$$

may be controlled by the reference current 121. Hence, the in-rush current 124 directly depends on the reference current 121 and the time interval which is required for charging the output capacitance 105. Using a feedback scheme the reference current 121 may be controlled to reduce the maximum 142 of the in-rush current 124. In other words, the slew rate control may be achieved by slowing down the turn-on time of the output switch 104.

Figure 1C:
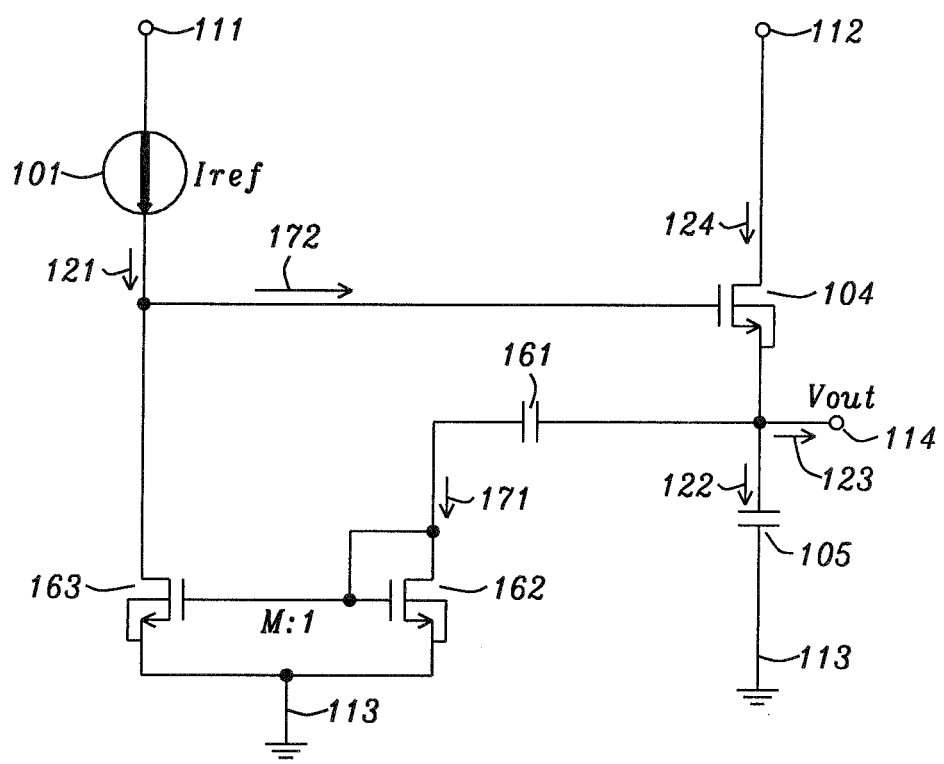
FIG. 1c shows an example controller with a slew rate control feedback loop.

A possible way to limit and control the in-rush current 124 through the output switch 104 is shown in FIG. 1c. In the illustrated example, a feedback capacitor 161 is coupled between the output node (e.g. the source) of the output switch 104 and the gate of the output switch 104. The feedback current 171 through the feedback capacitor 161 depends on the change of the output voltage 114. The feedback current 171 may be amplified using a current mirror 162, 163 with a mirror ratio 1:M. As a result of this, the gate current 172 (also referred to herein as the switch control current) for charging the gate of the output switch 104 is reduced by M times the feedback current 171, thereby slowing down the turn-on period of the output switch 104. Hence, the in-rush current 124 into the output switch 104 is limited during the turn-on period using a feedback scheme with a feedback capacitor 161.

The feedback scheme shown in FIG. 1c has several drawbacks. The bandwidth of the current amplifier (given by the current mirror 162, 163) is typically highly dependent on the feedback current 171 through the input transistor 162 of the current mirror 162, 163. Furthermore, relatively low feedback currents 171 may cause an overshoot of the in-rush current 124 at the beginning of the second phase 152 of the turn-on period. In addition, a mismatch of the input transistor 162 and the output transistor 163 of the current mirror 162, 163 typically influences the in-rush current 124. Furthermore, the first phase 151 of the turn-on period only depends on the reference current 121 which is provided by the reference current source. This leads to an increase of the overall turn-on time of the controller. The same applies to the third phase 153 of the turn-on period. In addition, the reference current 121 and the feedback current 171 typically need to be adjusted for output switches 104 of different sizes, due to variations of the gate capacitance of the output switches 104.

Figure 2:
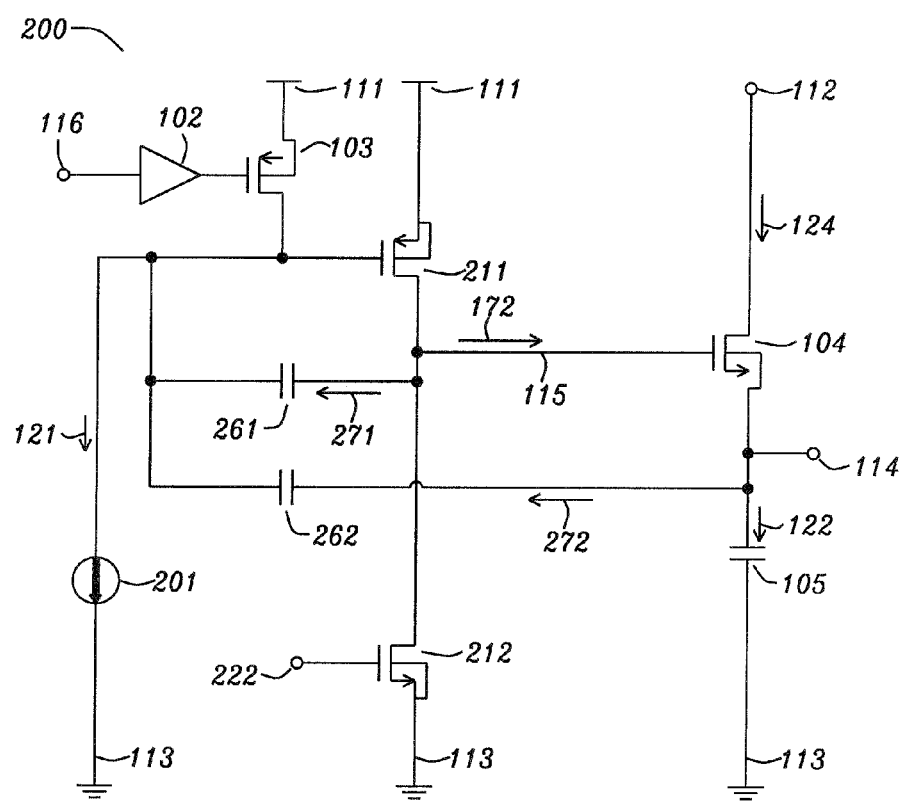
FIG. 2 shows a circuit diagram of an example slew rate/in-rush current controller.

FIG. 2 shows a circuit diagram of a slew rate controller or an in-rush current controller 200 which is configured to overcome at least some of the above mentioned drawbacks. In the slew rate controller 200 of FIG. 2, the current amplifier 162, 163 has been replaced by a class-A amplifier 211, 212, wherein the gate of an amplifier transistor 211 is fed by a gate current 273 (also referred to herein as the amplifier control current) which corresponds to the subtraction of the reference current 221 and the feedback current 272 through the feedback capacitor 262. As a result of this, there is no more need for a current amplifier 162, 163, thereby solving the issue of a current amplifier mismatch. The class-A amplifier 211, 212 also plays the role of a buffer and thereby may drive differently sized output switches 104. The dependency of the slew rate controller 200 on the gate capacitance of the output switch 104 is removed using the buffer 211, 212 (which may draw differently sized currents 172 from the control supply voltage 111). In addition, the slew rate controller 200 of FIG. 2 may be used to reduce the duration of the first phase 151, thereby allowing the second phase 152 of the turn-on period to be lengthened for reducing the maximum 142 of the in-rush current 124.

Hence, the controller 200 of FIG. 2 comprises a feedback capacitor 262 to control the on-time slew rate of the output switch 104, and a class-A amplifier 211, 212 to drive the output switch 104. The class-A amplifier 211, 212 comprises an amplifier transistor 211 and a bias transistor 212, wherein the bias transistor 212 is set using a (fixed) bias voltage 222. Using an auxiliary feedback capacitor 261 between the drain and the gate of the amplifier transistor 211 (which provides an additional feedback current 271), the loop phase margin may be increased and consequently a peak or maximum 142 of in-rush current 124 may be decreased.

As shown in FIG. 2, the output switch 104 is off, if the control signal 116 is low. The output switch 104 starts to turn on, whenever the control signal 116 is set to a high level. At this time instant, the control switch 103 turns off, and the gate of the amplifier transistor 211 discharges via the reference current source 201 (in accordance to the reference current 221). Since the class-A amplifier 211, 212 works as an inverter, decreasing the gate voltage of the amplifier transistor 211 leads to increasing the gate voltage 115 of the output switch 104.

The slew rate controller 200 remains in the first phase 151 until the output switch 104 turns on. The second phase 152 starts when the output switch 104 is in on-state. In this second phase 152, the in-rush current 124 starts to increase and charges the output capacitor 105. The in-rush current 124 can be limited and controlled by the feedback current 272 through the feedback capacitor 262. The slew rate controller 200 enters the third phase 153 when the output capacitor 105 is fully charged and when the output voltage 114 reaches the output supply voltage 112. At this time instant, the variation of the output voltage 114 is zero and the feedback current 272 drops to the minimum value, 0. As a result of this, the gate of the amplifier transistor 211 discharges more rapidly than during the second phase 152 and the gate of the output switch 104 reaches the maximum voltage, i.e. the control supply voltage 111.

As outlined above, the in-rush current 124 starts to increase during the second phase 152 of the turn-on period, when the output switch 104 is on. On the other hand, the in-rush current 124 is relatively small during the first and third phases 151, 153. Considering the above mentioned formula regarding the capacitor current $I_C$, the in-rush current 124 may be proportional to the output capacitor 105 and to the deviation of the output voltage 114 versus time. Assuming a constant output capacitor 105, increasing the duration of the second phase 152 leads to decreasing the maximum 142 of the in-rush current 124. Assuming that the gate of the output switch 104 charges to the maximum value, i.e. to the control supply voltage 111, in a total duration Tp, with Tp=Tp1-Tp2+Tp3, wherein Tp1, Tp2. Tp3 are the durations of the first, second, and third phases, respectively. In view of the formula for $I_C$ increasing dt, notably the duration Tp2 of the second phase 152, will reduce the maximum 142 of the in-rush current 124. At the same time, the duration of the first and third phases, i.e. Tp1 and Tp2 should be close to zero, in order to allow for a longer second phase 152 and in order to allow for reduced in-rush currents 124. Hence, assuming a constant total turn-on duration Tp, increasing of Tp2 may be achieved by decreasing Tp1 and/or Tp2.

Figure 3A:
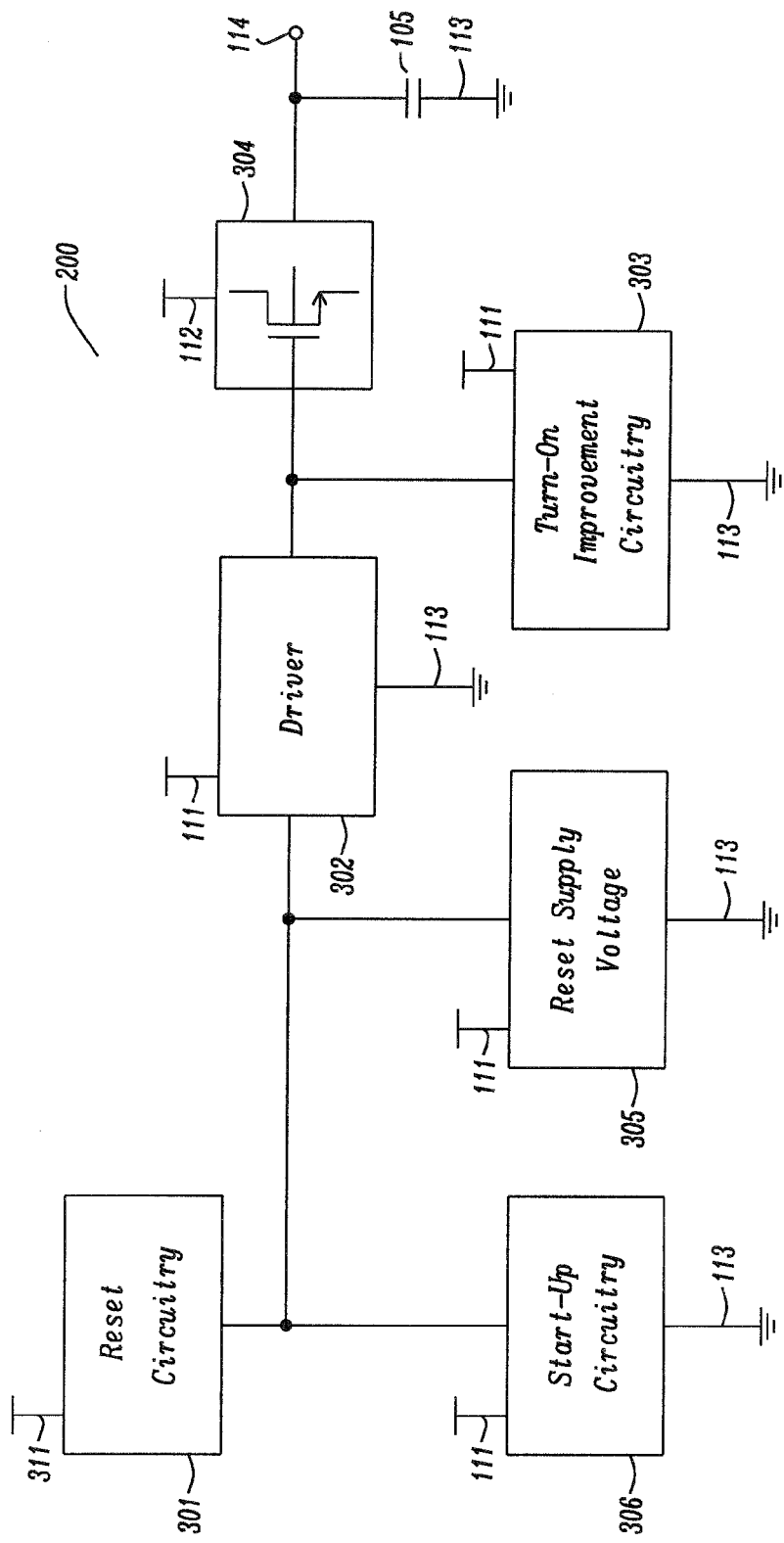
FIG. 3a shows a block diagram of an example slew rate/in-rush current controller.
Figure 3B:
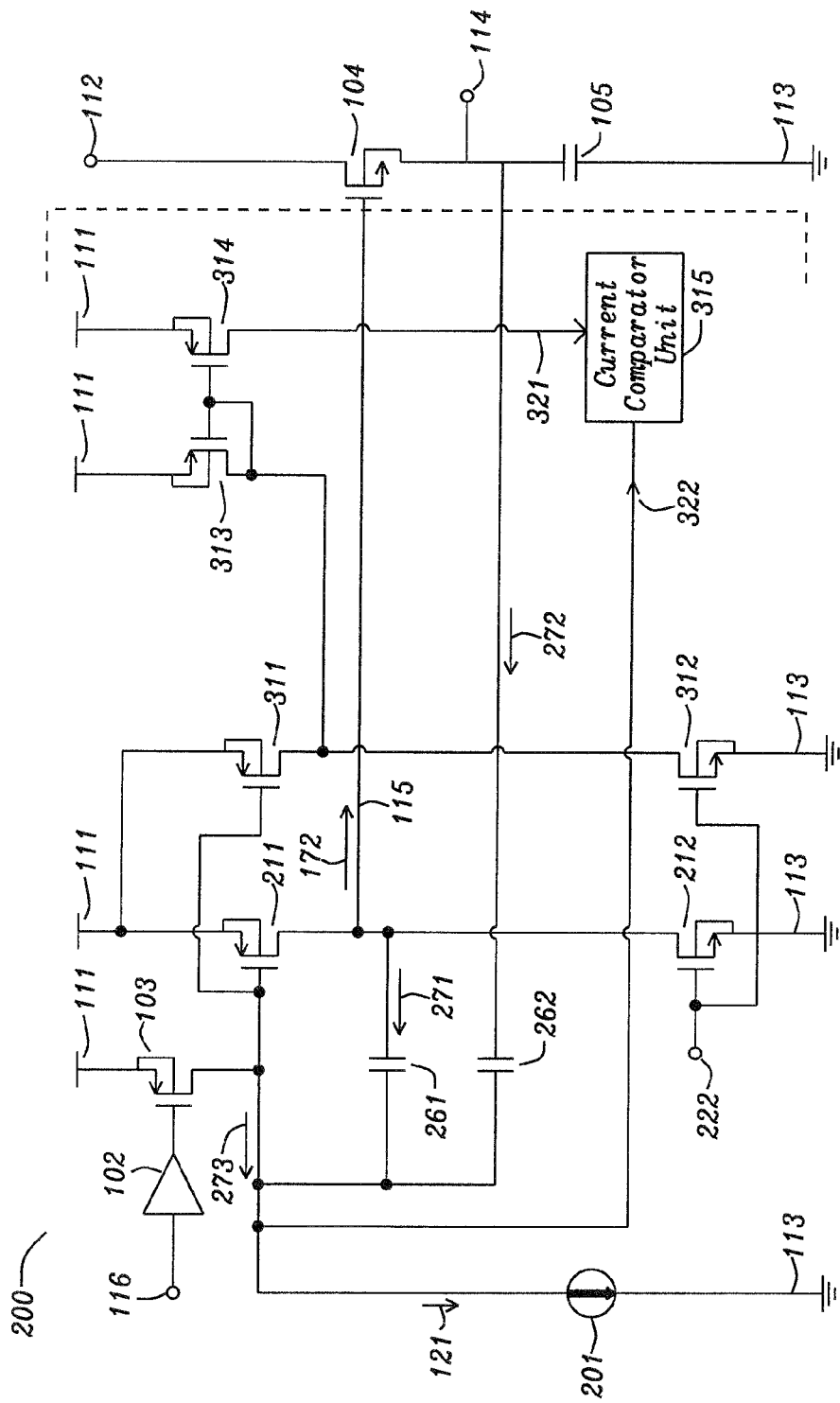
FIG. 3b shows a circuit diagram of another example slew rate/in-rush controller.

A possible solution for decreasing the duration Tp1 of the first phase 151 is shown in FIG. 3b. The slew rate controller 200 of FIG. 3b comprises the components of the controller 200 of FIG. 2, and additional components for decreasing the duration Tp1 of the first phase 151.

FIG. 3a shows a block diagram of the structure of a generic slew rate controller 200. The slew rate controller 200 may comprise reset circuitry 301 which may be related to a reset supply voltage 311 and/or start-up circuitry 306. An example for such circuitry is the control switch 103. Furthermore, the slew rate controller 200 typically comprises a driver 302 for the output stage 304 (which comprises the output switch 104). The driver 302 may e.g. comprise the amplifier transistor 211. In addition, the slew rate controller 200 may comprise slew rate control circuitry, such as the feedback capacitor 262 which is configured to provide the feedback current 272 for reducing the reference current 221 (during the second phase 152 of the turn-on period). In addition, the slew rate controller 200 may comprise turn-on improvement circuitry 303 which is configured to reduce the duration of the first and/or the third phase 151, 153 of a turn-on period of the output switch 104.

An example for such turn-on improvement circuitry 303 is illustrated in FIG. 3b. The circuitry 303 comprises a sampling transistor 311 and a sampling bias transistor 312, which are configured to sample the current through the amplifier transistor 211. An indication 321 of the current through the amplifier transistor 211 is provided to a current comparator unit 315 (via a current mirror 313, 314). In the illustrated example, the indication 321 decreases as the current through the sampling transistor 311 increases. The current comparator unit 315 may be configured to provide an auxiliary discharge current 322 (also referred to herein as an auxiliary current), in dependence of the sensed current 321. In particular, the current comparator unit 315 may be configured to provide an auxiliary discharge current 322, if the indication 321 is above a pre-determined current threshold (as is the case e.g. during the first phase 151). By doing this, the gate of the amplifier transistor 211 is discharged using the sum of the reference current 221 and the auxiliary discharge current 322, thereby reducing the duration of the first phase 151. On the other hand, the current comparator unit 315 may be configured to provide no auxiliary discharge current 322, if the indication 321 is below the pre-determined current threshold (as is the case e.g. during the second phase 152). As a result of this, the second phase 152 (and the slew rate control) is not affected by the auxiliary discharge current 322.

Figure 3C:
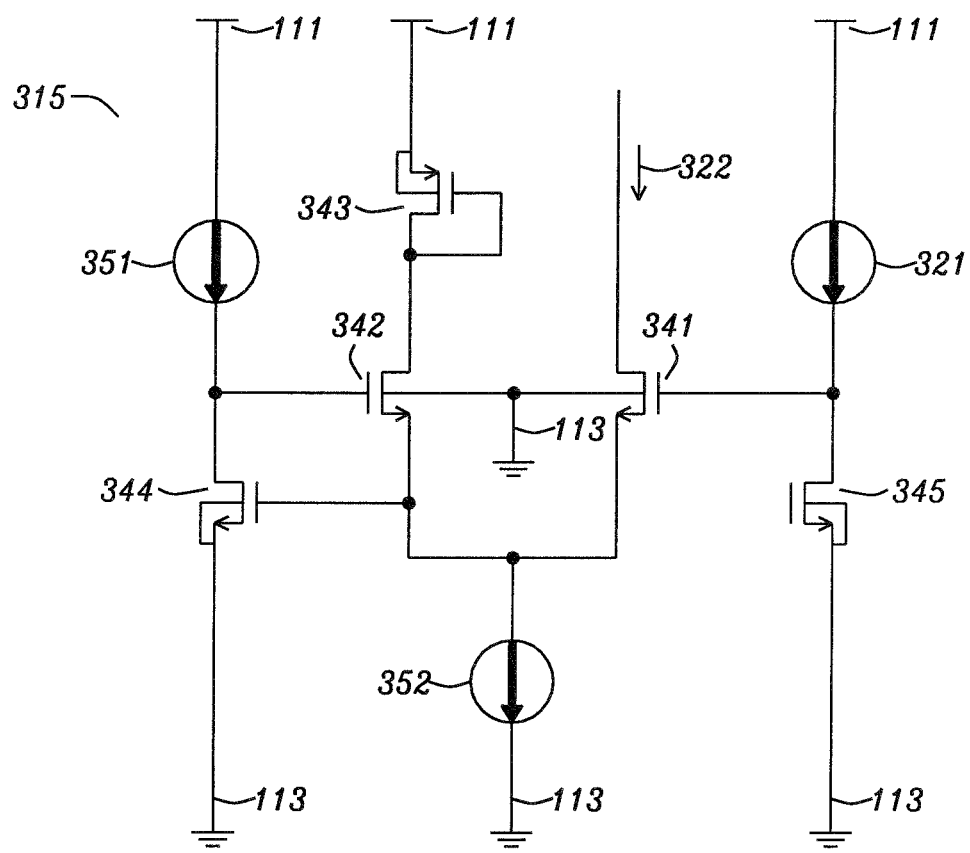
FIG. 3c shows a circuit diagram of an example "winner-take-all" circuit.
Figure 4:
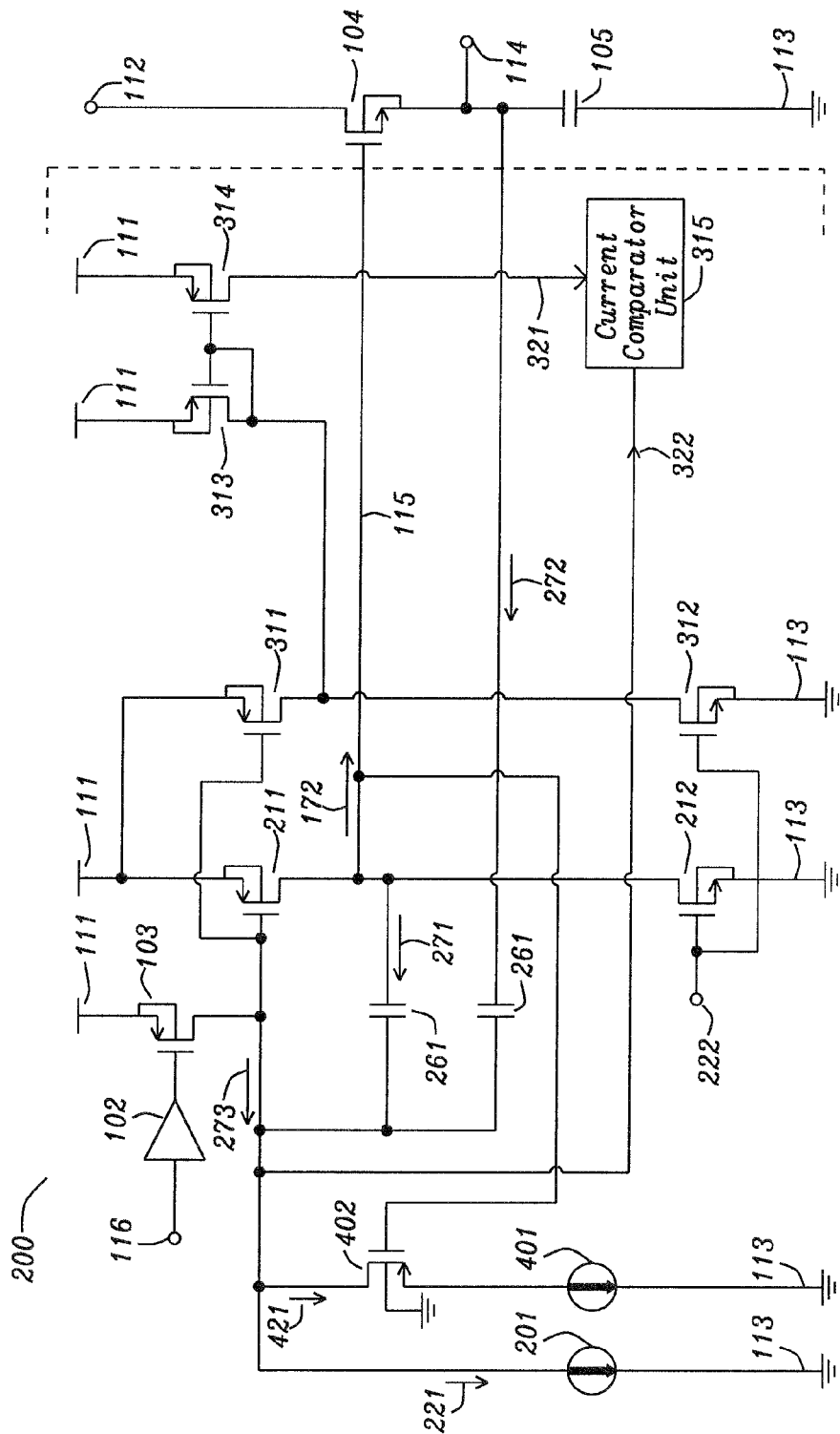
FIG. 4 shows a circuit diagram of another example slew rate/in-rush controller.

FIG. 3c shows a circuit diagram of an example current comparator unit 315. In particular, FIG. 3c shows an example "winner-take-all" (WTA) circuit. The WTA circuit comprises transistors 341, 342, 343, 344. The indication 321 is compared with a threshold current 351. If the indication 321 is greater than the threshold current 351, the auxiliary discharge current 322 corresponds to a boost current 352, otherwise the auxiliary discharge current 322 is set of zero.

As a result of using the turn-on improvement circuitry 303 of FIG. 3b, the gate of the amplifier transistor 211 will be discharged with an increased current. Hence, the time required for turning on the amplifier transistor 211 and the duration Tp1 of the first phase 151 is decreased. At the beginning, when the control signal 116 goes from low level to high level, the amplifier transistor 211 and the sampling transistor 311 are off, and the total current through the bias transistor 312 is mirrored by the current mirror 313, 314 to provide an indication 321 which is compared to the threshold current 351 in unit 315. The additional auxiliary discharge current 322 (i.e. the boost current 352) discharges the gate of the amplifier transistor 211, if the indication 321 is higher than the threshold current 351. As the sampling transistor 311 samples the current of the amplifier transistor 211 and as discharging of the gate of the amplifier transistor 211 turns on the amplifier transistor 211, the current through the sampling transistor 311 will increase gradually, and consequently the current through the transistor 313 decreases. The current boosting terminates at the time instant when the indication 321 is lower than the threshold current 351.

Figure 5A:
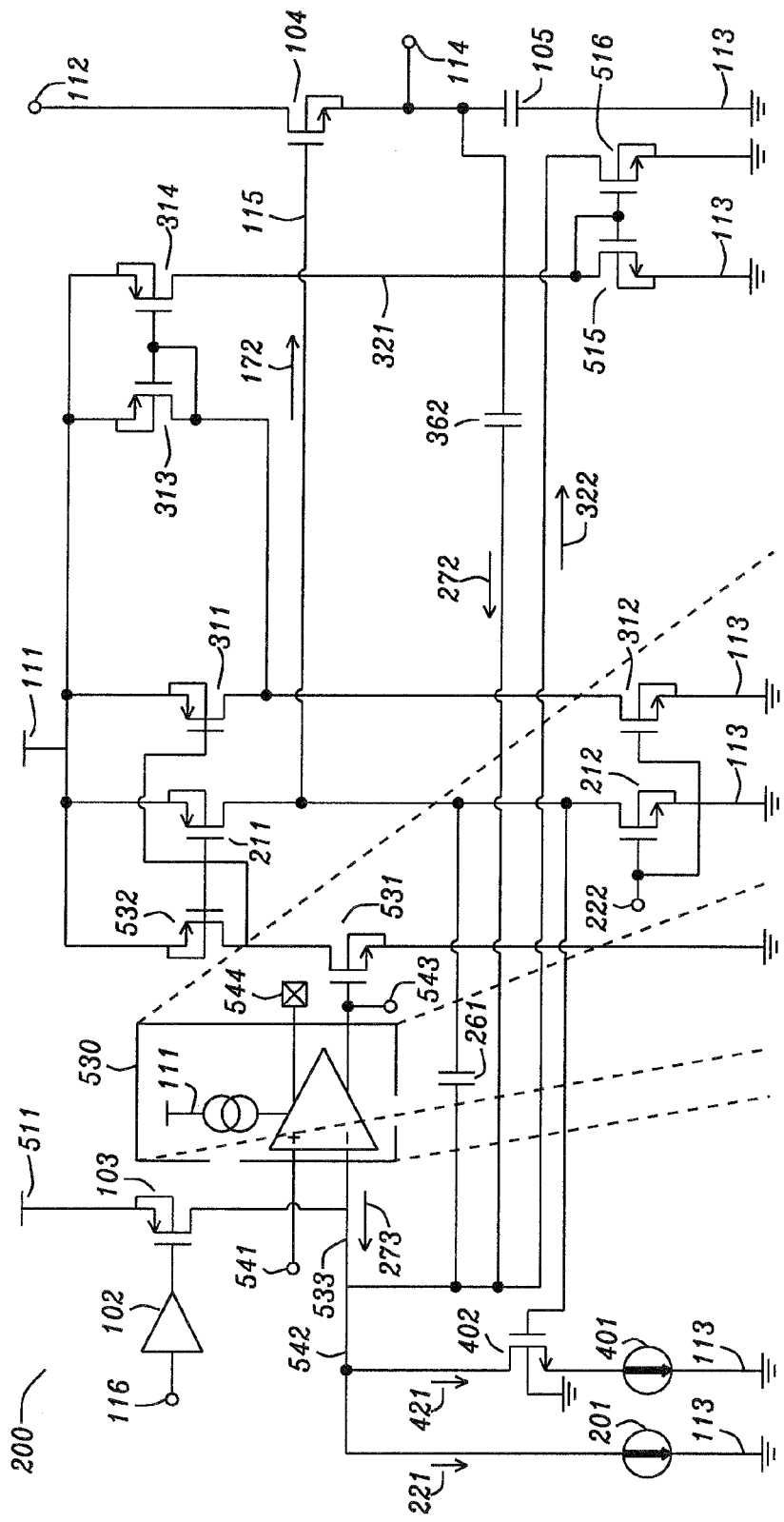
FIG. 5a shows a circuit diagram of another example slew rate/in-rush controller.

FIG. 5a shows another implementation of a WTA circuit. The sensing transistor 311 senses the current through the amplifier transistor 211 and when the current flow through the sensing transistor 311 is higher than the current of the sensing bias transistor 312, the transistor 313 will turn off and consequently the auxiliary discharge current 322 will be zero (via the current mirrors 313, 314 and 515, 516) and the first phase 151 terminates. As such, the circuitry acts like the current boosting shown in the context of FIG. 3c.

Considering the latency time to turn-on the output switch 104 and to generate the feedback current 271, a second reference current 421 may be activated with a delay to prevent a peak current through the output switch 104 at the beginning of the second phase 152. The second reference current 421 (also referred to as an auxiliary reference current) is provided using a second reference current source 401 (also referred to as an auxiliary reference current source). The second reference current is activated, if the gate voltage 115 of the output switch 104 is sufficiently high to turn on the switch 402. The second phase 152 terminates, if the output voltage 114 charges to the drain voltage 112 of the output switch 104.

Figure 5B:
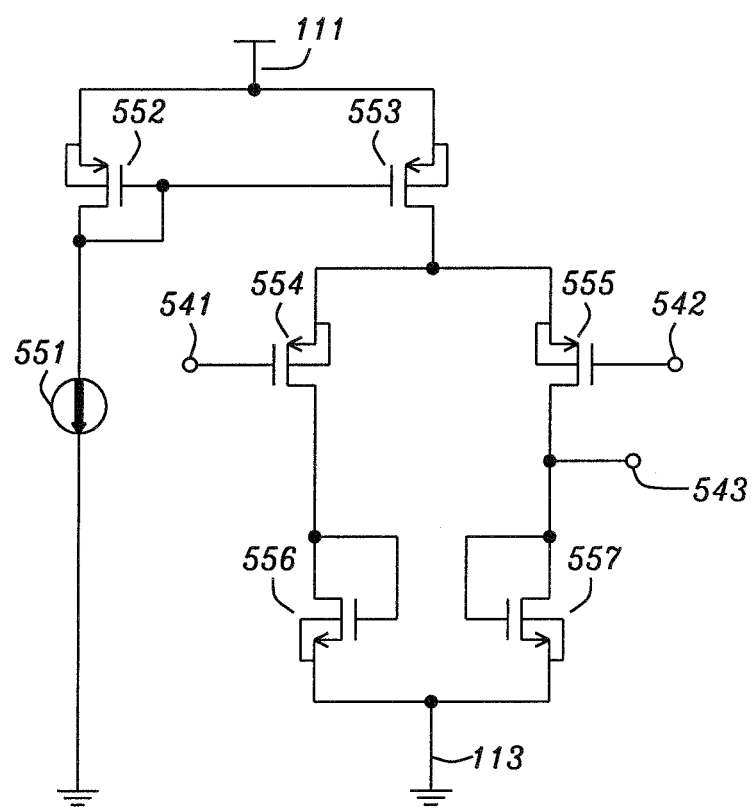
FIG. 5b shows a circuit diagram of an example differential amplifier.
Figure 5C:
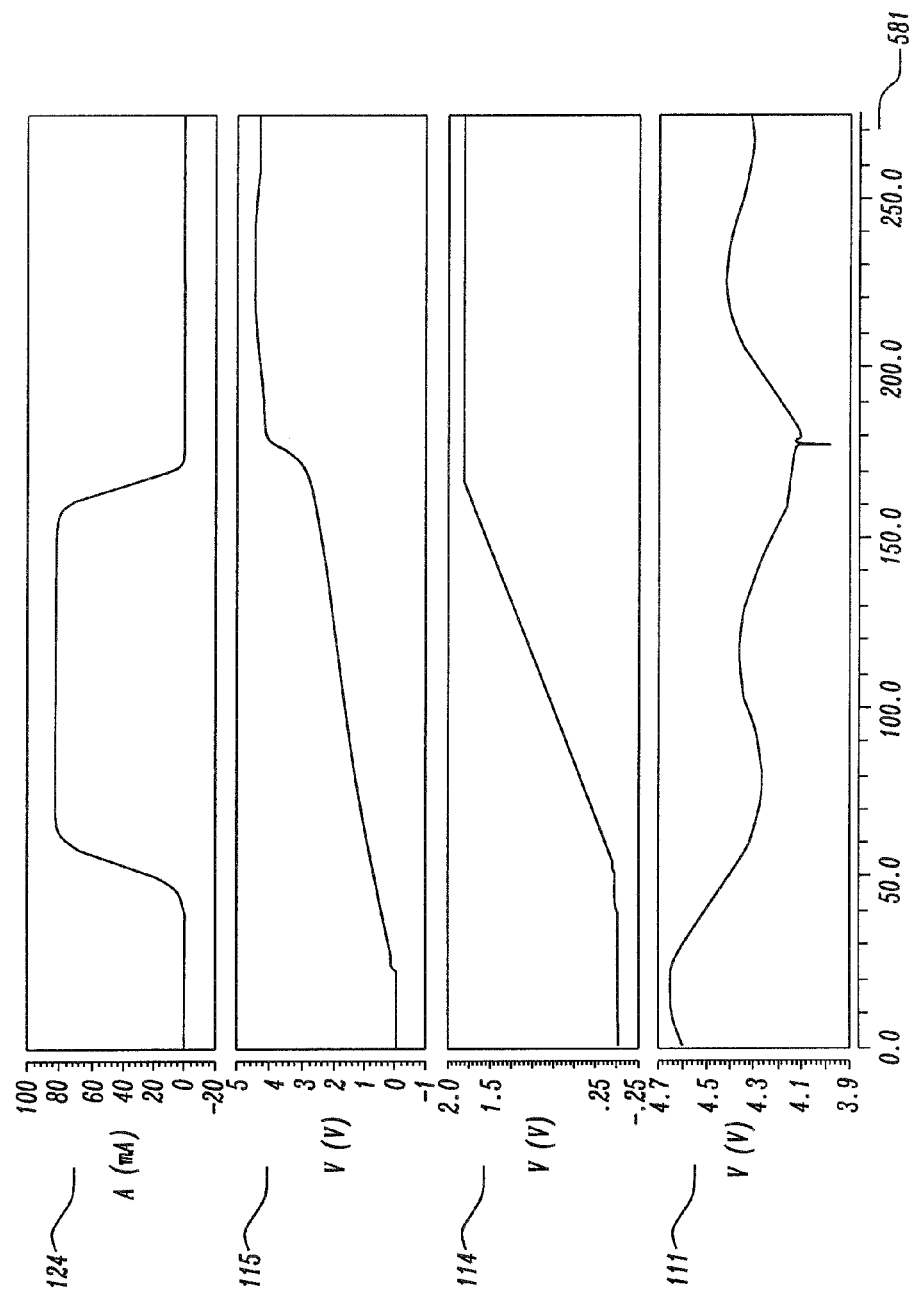
FIG. 5c shows example signals during the turn-on period of an output switch.
Figure 5D:
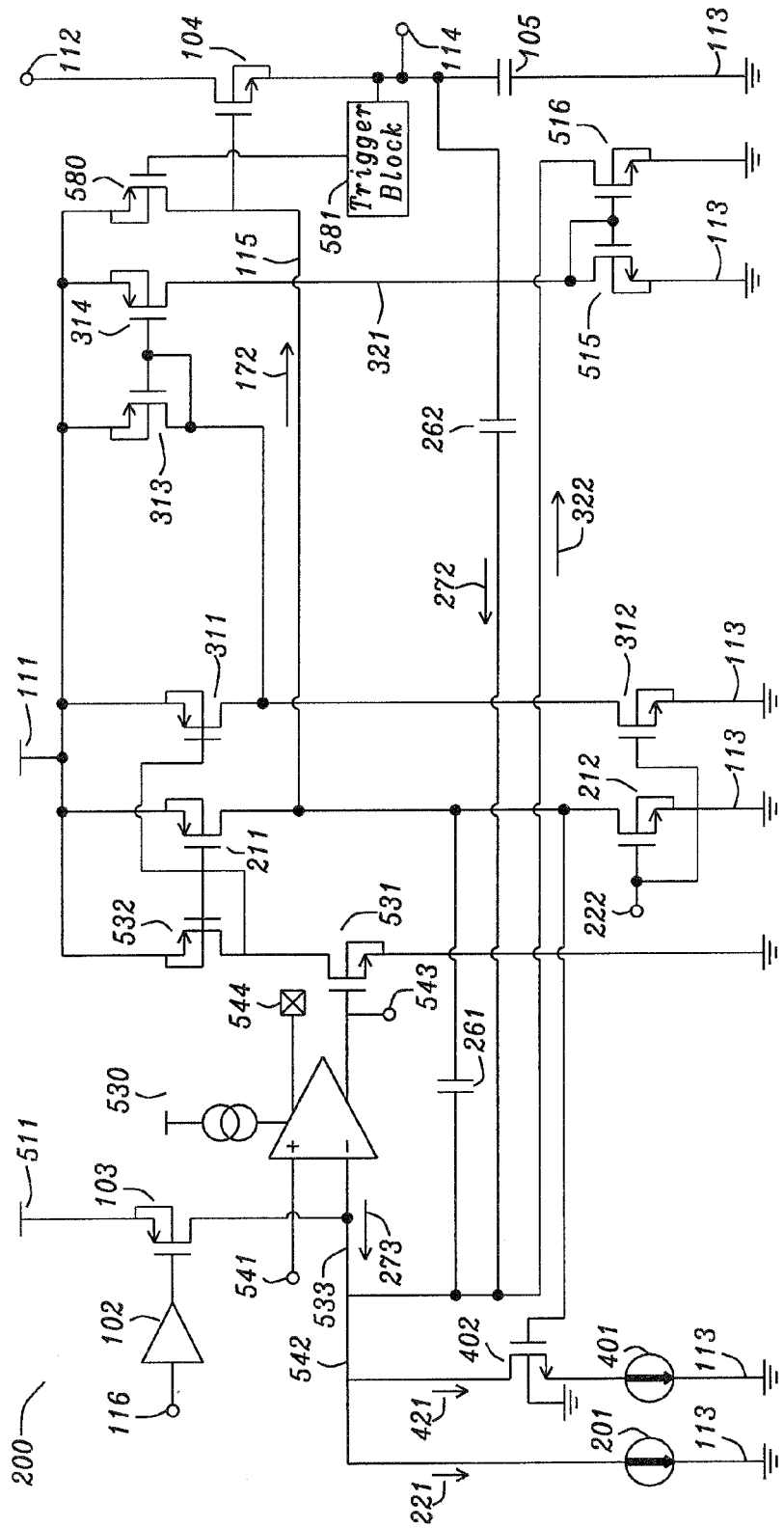
FIG. 5d shows a circuit diagram of another example slew rate/in-rush controller.

FIG. 5d shows means for accelerating the third phase 153. At a time instant at which the output capacitor 105 has been charged at maximum voltage (i.e. to the drain voltage 112), the current through the output switch 104 decreases gradually towards 0 A. The gate of the output switch 105 can be charged faster to decrease the duration Tp3 and consequently decrease the total duration Tp. The slew rate controller 200 may comprise a trigger block 581 which is configured to sense the output voltage 114 and whenever the output voltage 114 crosses a pre-determined trigger threshold voltage, the transistor 580 may be activated, which pulls up the gate of the output switch 104 to the control supply voltage 111.

The control supply voltage 111 may be noisy. This may cause problems for a slew rate controller 200 which makes use of a class A amplifier 211, 212. In particular, variations of the control supply voltage 111 may deteriorate the current flow through the amplifier transistor 211. On the other hand, simulations have shown that the controllers 200 which are described in the present document are immune against low variations of up to 10 mV peak to peak.

The PSRR (power supply rejection ratio) may be improved using a differential amplifier 530 (e.g. a high unity-gain-bandwidth amplifier) shown in FIG. 5a within the feedback loop of the controller 200. The gain of the differential amplifier 530 may not be important and a diode connected transistor 556, 557 may be used as a load (see FIG. 5b) in order to reduce the gain of the amplifier 530. Consequently the loop gain is reduced and stability of the controller 200 is improved. The slew rate control starts, when the control signal 116 toggles from low to high. The node 533 (with the first voltage 542) has been pre-charged to a reference voltage 511 and this node 533 is discharged in the first phase 151 by the reference current 221 and by the auxiliary discharge current 322. In the second phase 152, the node 533 continues to discharge using the reference current 221 and the gate of the output switch 104 is charged and the output switch 104 turns on.

In other words, the controller 200 of FIG. 5a makes use of a differential amplifier 530 which compares the voltage 542 at a first node 533 to a voltage 541 at a second node, and which generates a differential voltage 543 at the output of the differential amplifier 530. This differential voltage 543 is used to control the amplifier transistor 211 (using the master transistor 531 and the slave transistor 531). As shown in FIG. 5b, the differential amplifier 530 comprises a bias current source 551, 552, 553, input transistors 554, 555 and diode connected transistors 556, 557.

FIG. 5c shows simulation results. In particular, FIG. 5c shows the in-rush current 124, the output voltage 114, the gate voltage 115 and the control supply voltage 111 as a function of time 581. As can be seen, the control supply voltage 111 (e.g. a charge pump voltage) is not clean and has relatively large signal variations. Nevertheless, an accurate control of the in-rush current 124 and of the slew rate of the output voltage 114 may be achieved using the controller 200 described in the present document.

FIG. 6 shows a flow chart of an example method 600 for controlling an in-rush current through a semiconductor output switch 104 (e.g. a MOS transistor) during a turn-on period of the output switch 104. The output switch 104 is arranged in series with an output capacitor 105 between an output supply voltage 112 and ground 113. The output switch 104 comprises a switch control port (e.g. a gate) for controlling an output current 124 through the switch 104 and for controlling an output voltage 114 at an output node (e.g. a source of the output switch 104) between the output switch 104 and the output capacitor 105. The output current 124 may also be referred to as the in-rush current or the drain-source current through the output switch 104.

The method 600 comprises sourcing 601 a switch control current 172 to the switch control port from a control supply voltage 111 (notably in case of an n-type MOS output switch 104) or sinking 601 a switch control current 172 from the switch control port towards ground 113 (notably in case of a p-type MOS output switch 104) using an amplifier 530, 211, 212, 532, 531. As a result of the switch control current 172 a gate of the output switch 104 may be charged (in case of an NMOS output switch) or discharged (in case of a PMOS output switch) for turning on the output switch 104. The amplifier 530, 211, 212, 532, 531 provides the switch control current 172 directly from the control supply voltage 111 or to ground 113, thereby enabling the controller 200 to charge/discharge differently sized gate capacitances. As such, the amplifier provides a buffer function.

The switch control current 172 is dependent on an amplifier control current 273 at an amplifier control port 533 of the amplifier 530, 211, 212, 532, 531. The method 600 comprises providing 602 a reference current 221 at the amplifier control port 533, subject to a control signal 116 indicating that the output switch 104 is to be turned on. The amplifier 530, 211, 212, 532, 531 transforms the reference current 221 into a switch control current 172 (in accordance to a gain factor of the amplifier 530, 211, 212, 532, 531), thereby causing the output switch 104 to be turned on.

The method 600 further comprises providing 603 a feedback current 272 at the amplifier control port 533 in dependence of a variation of the output voltage 114, e.g. using a feedback capacitor 262 arranged to couple the output node to the amplifier control port 533. The feedback current 272 typically subtracts from the reference current 221, in case of an increase of the output voltage 114. As a result of this, the net current at the amplifier control port 533 is reduced, as soon as the output switch 114 starts to be turned on. Hence, the slew rate of the output switch 114 and the in-rush current 124 through the output switch 114 is controlled.

The schemes which have been described in the present document control the in-rush current 124 through the output switch 104. The controllers 200 may be used for scalable output switches 104 without the need to change the controller 200 and the size of the elements (e.g. transistors and feedback capacitors of the controller 200). The turn-on duration of the output switch 104 may be controlled using different values for the reference current 221, which leads to different in-rush currents 124. The controller 200 is immune to variations of the control supply voltage 111. The schemes have been described for the control of an NMOS switch. It should be noted that the schemes are also applicable to the control of an output PMOS switch. In this case, the transistors shown in the figures of the present document may need to be exchanged at least partially from NMOS to PMOS or PMOS to NMOS.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An in-rush current controller configured to turn-on a semiconductor output switch, wherein the output switch is arranged in series with an output capacitor between an output supply voltage and ground, wherein the output switch comprises a switch control port for controlling an output current through the switch and for controlling an output voltage at an output node between the output switch and the output capacitor, wherein the controller comprises an amplifier configured to source a switch control current to the switch control port from a control supply voltage or to sink a switch control current from the switch control port towards ground, for turning on the output switch; wherein the switch control current is dependent on an amplifier control current at an amplifier control port;

a reference current source configured to provide a reference current at the amplifier control port, subject to a control signal indicating that the output switch is to be turned on;

a feedback capacitor arranged to couple the output node to the amplifier control port, and configured to provide a feedback current at the amplifier control port in dependence of a variation of the output voltage, wherein the feedback current subtracts from the reference current; and an auxiliary feedback capacitor arranged to directly couple the switch control port to the amplifier control port and configured to provide an auxiliary feedback current directly at the amplifier control port in dependence of a variation of a switch control voltage at the switch control port, wherein the auxiliary feedback current subtracts from the reference current.

2. The in-rush current controller of claim 1, wherein
the amplifier comprises an amplifier transistor and a bias transistor which are arranged in series between the control supply voltage and ground; and
the switch control port is coupled to a midpoint between the amplifier transistor and the bias transistor.

3. The in-rush current controller of claim 2, wherein
a current through the amplifier transistor is controlled via a transistor control port; and
a current at the transistor control port is dependent on the reference current and the feedback current.

4. The in-rush current controller of any of claim 2, wherein
the amplifier comprises a differential amplifier configured to determine a differential voltage in dependence of the reference current and the feedback current;
an input port of the differential amplifier corresponds to the amplifier control port; and
the amplifier transistor is controlled in dependence of the differential voltage.

5. The in-rush current controller of claim 4, wherein
the amplifier comprises a master transistor and a slave transistor which are arranged in series between the control supply voltage and ground;
a current through the master transistor is controlled using the differential voltage; and
the slave transistor forms a current mirror with the amplifier transistor.

6. The in-rush current controller of claim 1, further comprising
sensing means configured to provide an indication of the switch control current at the switch control port; and
current boosting means configured to provide an auxiliary current at the amplifier control port, which adds to the reference current, if the indication indicates that the switch control current is below a pre-determined current threshold.

7. The in-rush current controller of claim 6, wherein
the sensing means comprise a sensing transistor and a sensing bias transistor which are arranged in series between the control supply voltage and ground;
the indication of the switch control current is dependent on a current at a midpoint between the sensing transistor and the sensing bias transistor;
a control port of the sensing transistor is coupled to a control port of the amplifier transistor; and
a control port of the sensing bias transistor is coupled to a control port of the bias transistor.

8. The in-rush current controller of claim 7, wherein
the current boosting means comprise a current mirror; and/or
the current boosting means comprise a current comparator.

9. The in-rush current controller of claim 1, further comprising an auxiliary reference current source which is configured to provide an auxiliary reference current which adds to the reference current, if a switch control voltage at the switch control port exceeds a pre-determined voltage threshold.

10. The in-rush current controller of claim 1, wherein
the output switch is a MOS transistor; and
switch control port is a gate of the output switch.

11. The in-rush current controller of claim 10, wherein
the output switch is an n-type MOS transistor;

the amplifier transistor is a p-type MOS transistor; and
a control port of the amplifier transistor comprises a gate of the amplifier transistor.

12. The in-rush current controller of claim 1, wherein the reference current is a current towards ground.

13. The in-rush current controller of claim 1, further comprising a control switch which is configured to
couple the amplifier control port to a high potential for turning off the output switch, and
decouple the amplifier control port from the high potential for turning on the output switch, such that a current at the amplifier control port depends on the reference current and the feedback current.

14. A method for controlling an in-rush current through a semiconductor output switch during a turn-on period of the output switch, wherein the output switch is arranged in series with an output capacitor, wherein the output switch comprises a switch control port for controlling an output current through the switch and for controlling an output voltage at an output node between the output switch and the output capacitor, wherein the method comprises
sourcing a switch control current to the switch control port or sinking a switch control current from the switch control port using an amplifier, for turning on the output switch; wherein the switch control current is dependent on an amplifier control current at an amplifier control port of the amplifier;
providing a reference current at the amplifier control port, subject to a control signal indicating that the output switch is to be turned on;
providing a feedback current at the amplifier control port in dependence of a variation of the output voltage; and
providing an auxiliary feedback current directly at the amplifier control port in dependence of a variation of a switch control voltage at the switch control port using an auxiliary feedback capacitor arranged to directly couple the switch control port to the amplifier control port, wherein the auxiliary feedback current subtracts from the reference current.

15. The method of claim 14, wherein
the amplifier comprises an amplifier transistor and a bias transistor which are arranged in series between the control supply voltage and ground; and
the switch control port is coupled to a midpoint between the amplifier transistor and the bias transistor.

16. The method of claim 15, wherein
a current through the amplifier transistor is controlled via a transistor control port; and
a current at the transistor control port is dependent on the reference current and the feedback current.

17. The method of claim 15, wherein
the amplifier comprises a differential amplifier to determine a differential voltage in dependence of the reference current and the feedback current;
an input port of the differential amplifier corresponds to the amplifier control port; and
the amplifier transistor is controlled in dependence of the differential voltage.

18. The method of claim 17, wherein
the amplifier comprises a master transistor and a slave transistor which are arranged in series between the control supply voltage and ground;
a current through the master transistor is controlled using the differential voltage; and
the slave transistor forms a current mirror with the amplifier transistor.

19. The method of claim 14, further comprising the steps of:
sensing to provide an indication of the switch control current at the switch control port; and
boosting current to provide an auxiliary current at the amplifier control port, which adds to the reference current, if the indication indicates that the switch control current is below a pre-determined current threshold.

20. The method of claim 19, wherein
the sensing means comprise a sensing transistor and a sensing bias transistor which are arranged in series between the control supply voltage and ground;
the indication of the switch control current is dependent on a current at a midpoint between the sensing transistor and the sensing bias transistor;
a control port of the sensing transistor is coupled to a control port of the amplifier transistor; and
a control port of the sensing bias transistor is coupled to a control port of the bias transistor.

21. The method of claim 20, wherein
the current boosting means comprise a current mirror; and/or
the current boosting means comprise a current comparator.

22. The method of claim 14, further comprising the step of:
providing an auxiliary reference current which adds to the reference current, if a switch control voltage at the switch control port exceeds a pre-determined voltage threshold.

23. The method of claim 14, wherein
the output switch is a MOS transistor; and
switch control port is a gate of the output switch.

24. The method of claim 23, wherein
the output switch is an n-type MOS transistor;
the amplifier transistor is a p-type MOS transistor; and
a control port of the amplifier transistor comprises a gate of the amplifier transistor.

25. The method of claim 14, wherein the reference current is a current towards ground.

26. The method of claim 14, further comprising the steps of:
coupling with a control switch the amplifier control port to a high potential for turning off the output switch, and
decoupling with a control switch the amplifier control port from the high potential for turning on the output switch, such that a current at the amplifier control port depends on the reference current and the feedback current.

* * * * *